(12) United States Patent
Chen et al.

(10) Patent No.: US 8,354,346 B2
(45) Date of Patent: *Jan. 15, 2013

(54) METHOD FOR FABRICATING LOW-K DIELECTRIC AND CU INTERCONNECT

(75) Inventors: Chih-Hao Chen, Hsin-Chu (TW);
Chia-Cheng Chou, Keelung (TW);
Ming-Chung Liang, Hsin-Chu (TW);
Keng-Chu Lin, Ping-Tung (TW);
Tzu-Li Lee, Yunlin (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/179,139

(22) Filed: Jul. 8, 2011

(65) Prior Publication Data

US 2011/0263127 A1   Oct. 27, 2011

Related U.S. Application Data

(63) Continuation of application No. 11/764,053, filed on Jun. 15, 2007, now Pat. No. 7,998,873.

(51) Int. Cl.
*H01L 21/302* (2006.01)
*H01L 21/461* (2006.01)
(52) U.S. Cl. ......... 438/725; 438/618; 438/622; 438/623
(58) Field of Classification Search ............... 438/618, 438/622, 623, 725
See application file for complete search history.

(56) References Cited

U.S. PATENT DOCUMENTS

| | | |
|---|---|---|
| 7,078,350 B2 | 7/2006 | Kim et al. |
| 7,129,159 B2 | 10/2006 | America et al. |
| 7,129,162 B2 | 10/2006 | Hong et al. |
| 2001/0017402 A1 | 8/2001 | Usami |
| 2005/0095869 A1 | 5/2005 | Tao et al. |
| 2008/0057728 A1 | 3/2008 | Shimura et al. |

*Primary Examiner* — Jarrett Stark
*Assistant Examiner* — John M Parker
(74) *Attorney, Agent, or Firm* — Slater & Matsil, L.L.P.

(57) ABSTRACT

A system and method for improving the performance of an integrated circuit by lowering RC delay time is provided. A preferred embodiment comprises adding a reactive etch gas to the ash/flush plasma process following a low-k dielectric etch. The illustrative embodiments implement a removal of the damage layer that is formed during a low-k dielectric etch.

16 Claims, 6 Drawing Sheets

US 8,354,346 B2

METHOD FOR FABRICATING LOW-K DIELECTRIC AND CU INTERCONNECT

This application is a divisional of U.S. patent application Ser. No. 11/764,053, filed on Jun. 15, 2007, entitled "Method for Fabricating Low-k Dielectric and Cu Interconnect," which application is hereby incorporated herein by reference in its entirety.

TECHNICAL FIELD

The present invention relates generally to integrated circuits, and more particularly to a system and method for minimizing damage caused by a low-k dielectric etch process.

BACKGROUND

In semiconductor manufacturing, a low-k dielectric is a material with a small dielectric constant relative to silicon dioxide. Silicon dioxide has a k value of 3.9. Materials with k values less than 3.9 are considered low-k dielectric materials. In digital circuits, insulating dielectrics separate interconnects and transistors from one another. As integrated circuits have minimized, components have scaled correspondingly and the insulating dielectrics have thinned to the point where charge build up and crosstalk adversely affect the performance of the circuit. Replacing the silicon dioxide with a low-k dielectric reduces parasitic capacitance, enabling faster switching speeds and lower heat dissipation.

Dual damascene processing is a method for fabricating planar interconnects. Damascene wiring interconnects are formed by depositing a dielectric layer on a planar surface, patterning the dielectric layer using photolithography and etching, then filling the recesses with conductive metal, often copper (Cu). The excess metal is removed by chemical mechanical polishing (CMP), while the trenches or channels remain filled with metal. In the damascene processing approach, the deposited conductive metal is deposited into a patterned insulator, typically a low-k dielectric. This is desirable because mask alignment, dimensional control, rework, and the etching process are all easier when applied to a dielectric rather than metal films. Damascene processing achieves these benefits by shifting the enhanced filling and planarization requirements from dielectric to metal films, and by shifting control over interconnect thickness from metal deposition to insulator patterning and metal CMP.

The low-k dielectric used in the damascene process is susceptible to damage during the damascene etch process. In particular, the low-k dielectric is vulnerable to damage during etch, photoresist ashing and etch by-product, such as polymer-like residue stripping steps. Damage to the low-k dielectric layer is generated during processing because of carbon loss. This damage may cause a higher capacitance and therefore degrade device performance.

The speed at which a signal is propagated in an integrated circuit is limited by the delay through the metal line carrying the signal. This delay, commonly known as "RC delay," is determined by the product of the resistance (R) and capacitance (C) of the metal line and the interconnections between conductors. Reducing the resistance and/or capacitance of a metal line lowers its RC delay and increases signal propagation speed. Therefore, reducing the RC delay of metal lines plays a major role in making integrated circuits run faster.

SUMMARY OF THE INVENTION

This and other problems are generally solved or circumvented, and technical advantages are generally achieved, by preferred embodiments of the present invention which remove the damage layer during photoresist removal (termed hereinafter "ash") or a etch by-product polymer stripping step (termed hereinafter "flush"). Removing the damage layer is accomplished by adding a reactive etching gas to the ash/flush gas during the ash/flush plasma process.

An embodiment is a method for manufacturing a damascene process on a semiconductor wafer. The method comprises depositing a layer of low-k dielectric on the wafer, patterning a photoresist layer on the layer of low-k dielectric, performing a damascene etch on the layer of low-k dielectric, and performing an ash/flush plasma process on the photoresist layer to remove the photoresist layer and on exposed portions of the layer of low-k dielectric. The ash/flush process uses a combined ash/flush gas, and the combined ash/flush gas comprises an ash/flush gas with a percentage of reactive etching gas. The ash/flush process does not etch the layer of low-k dielectric.

According to a further embodiment, a method comprises depositing a low-k dielectric layer on a substrate, patterning a photoresist over the low-k dielectric layer, etching the low-k dielectric layer, and after the etching, removing the photoresist and stripping a by-product of the etching simultaneously. The removing and the stripping uses a gas comprising an ash/flush gas and a reactive etching gas.

According to another embodiment, a method comprises depositing a low-k dielectric layer on a substrate, patterning a photoresist over the low-k dielectric layer, etching the low-k dielectric layer, and removing the photoresist and a damaged low-k dielectric layer simultaneously. The removing uses a gas comprising an ash/flush gas and a reactive etching gas.

The foregoing has outlined rather broadly the features and technical advantages of embodiments in order that the detailed description that follows may be better understood. Additional features and advantages of embodiments will be described hereinafter which form the subject of the claims. It should be appreciated by those skilled in the art that the conception and specific embodiments disclosed may be readily utilized as a basis for modifying or designing other structures or processes for carrying out the same purposes. It should also be realized by those skilled in the art that such equivalent constructions do not depart from the spirit and scope of embodiments as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a dual damascene etch process. The invention may also be applied, however, to other low-k etch processes.

Figure 1:
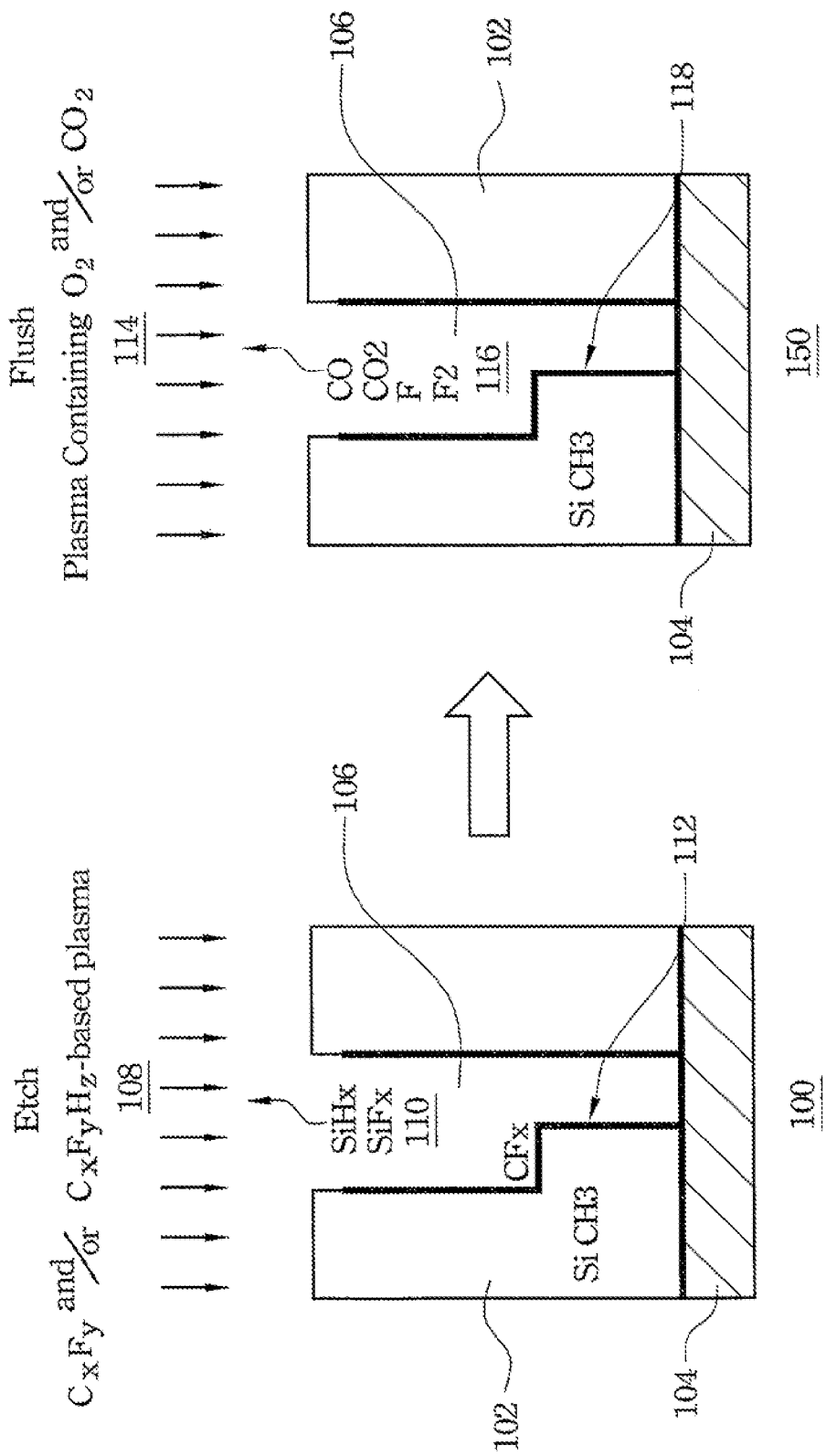
FIG. 1 is a depiction of a prior art process illustrating the formation of the damage layer in the low-k dielectric layer following an etch process.

With reference now to FIG. 1, shown are two cross sectional drawings of an etch region of a low-k dielectric of a known dual damascene process. Post etch drawing 100 shows low-k dielectric layer 102 on metal layer 104 following etch. The dual damascene etch has been performed, leaving opening 106 in low-k dielectric layer 102. Reactive etch gases $C_xF_yH_z$ and/or $C_xF_y$ 108 were used to etch low-k dielectric layer 102. As SiHx and SiFx 110 outgases from opening 106, fluorocarbon layer 112 is formed on the surfaces of opening 106.

Post ash/flush drawing 150 shows the layers 102 and 104, as well as opening 106 of post etch drawing 100. Standard ash/flush gases such as $O_2$ and/or $CO_2$ 114, for example, are used in the ash/flush step, while CO, $CO_2$, F, and $F_2$ 116 are shown outgasing from opening 106. In this prior art process a damage layer 118 is shown in place of fluorocarbon layer 112. Damage layer 118 is a carbon depleted layer with dangling Si bonds. These dangling Si bonds absorb moisture in the ambient gas forming damage layer 118.

Figure 2:
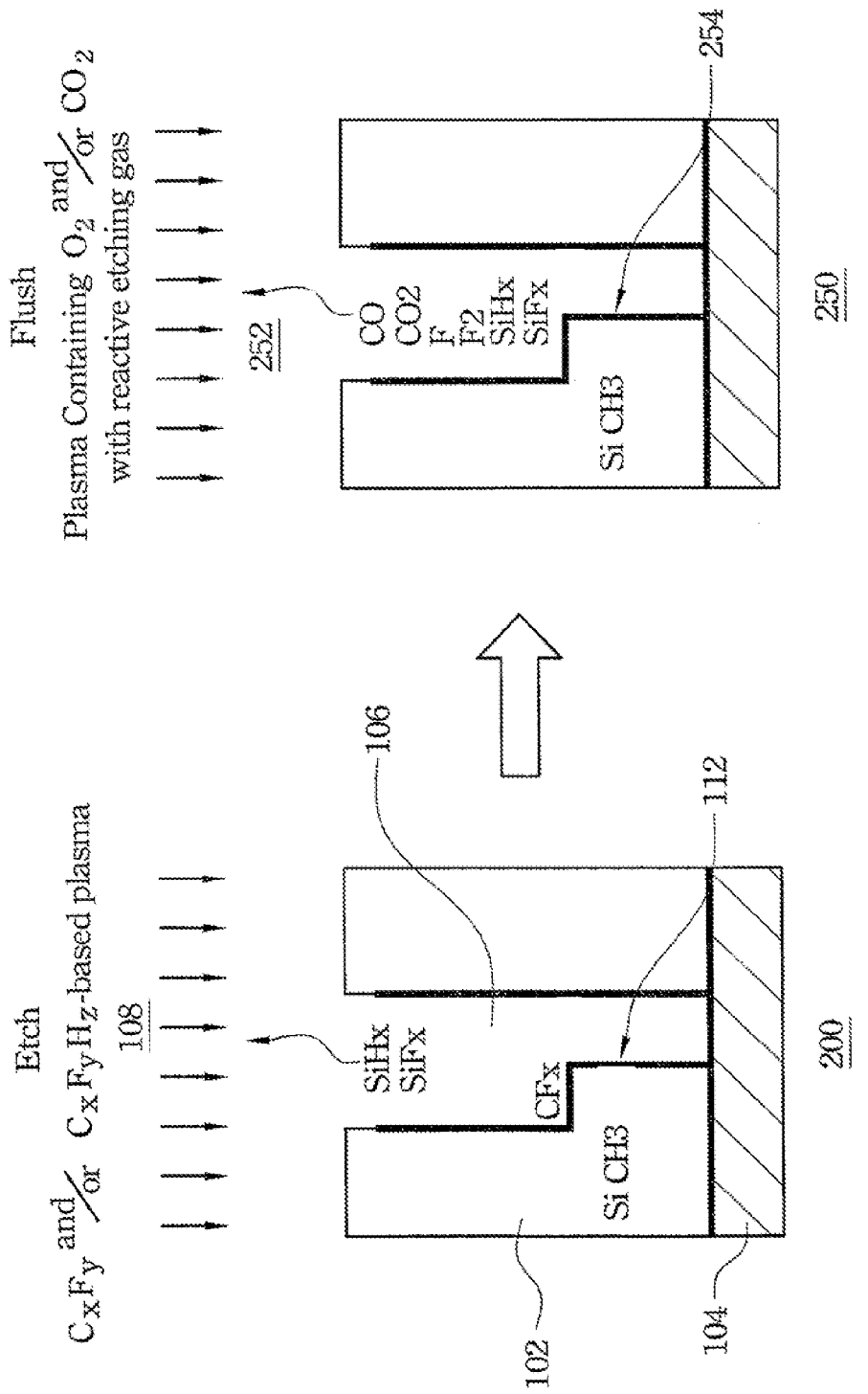
FIG. 2 is a depiction of the damage layer removal in accordance with the illustrative embodiments of the present invention.

Turning now to FIG. 2, a depiction of the damage layer removal is shown in accordance with the illustrative embodiments. The etch step in this embodiment of the present invention may be the same as the etch step shown in FIG. 1; therefore post etch drawing 200 is the same as post etch drawing 100 of FIG. 1. Ash/flush drawing 250, however shows a combination ash/flush gas 252 comprised of a standard ash/flush gas $O_2$ and/or $CO_2$ and reactive etching gas. As a consequence of this ash/flush plasma step, opening 106 shows clean surface 254. The damage layer, such as the damage layer 118 in FIG. 1 has been removed during ashing/flushing.

Figure 3:
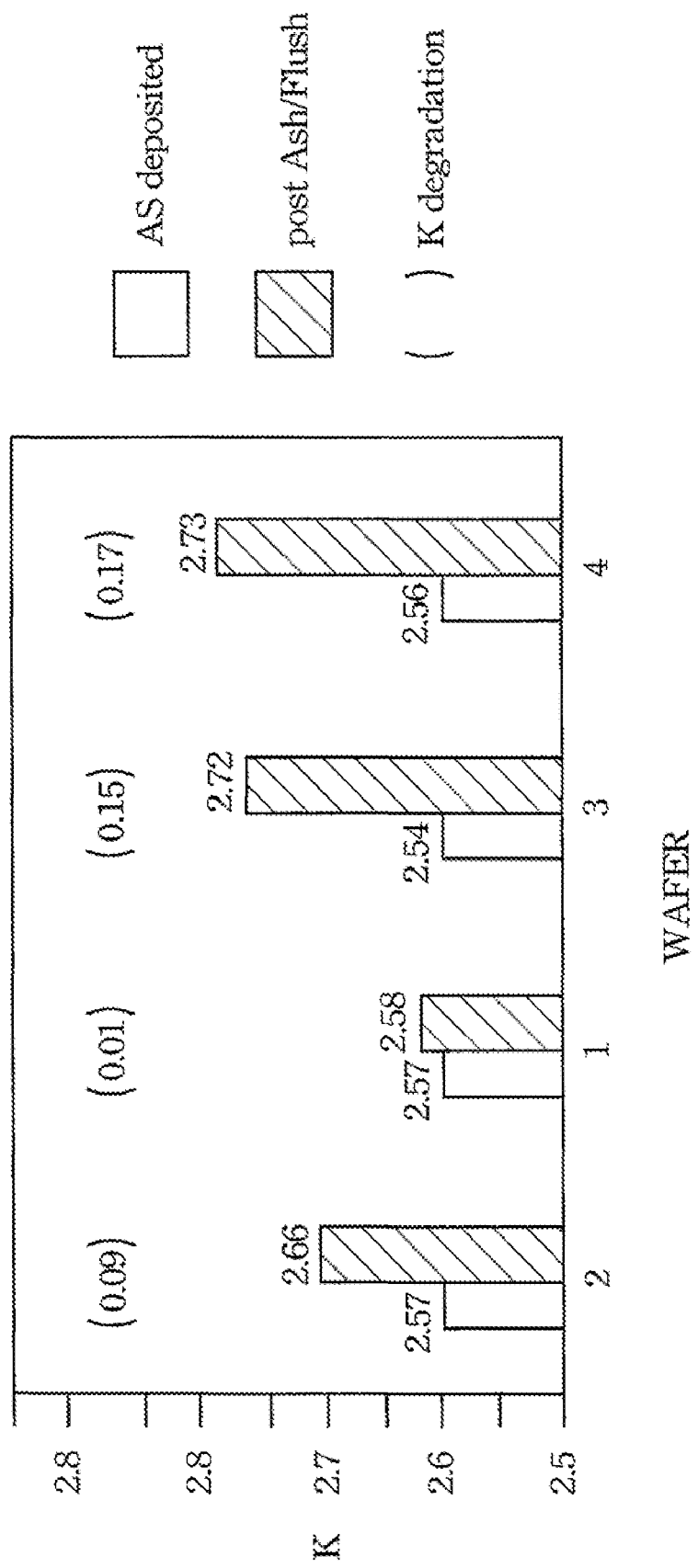
FIG. 3 is a comparison plot of k values. The first value for each of a series of wafers was measured before the low-k dielectric was etched, as a control, and then the second low-k dielectric value was measured post etch and damage layer removal, in accordance with the illustrative embodiments of the present invention.

FIG. 3 is a plot of the k value of the low-k dielectric material for four wafers processed with four different process recipes. A table of the ash/flush process recipe for each wafer is shown below:

| | Process Parameters for Ash/Flush Step | | |
|---|---|---|---|
| Wafer number | Pressure (mT) | Power (W) | Ash/Flush gas (sccm) |
| 1 | Low pressure(LP) | Low power(LPW) | $CO_2 + C_4F_8$ |
| 2 | LP | LPW | $CO_2$ + low flow $C_4F_8$ than Wafer 1 |
| 3 | LP | LPW | $CO_2$ |
| 4 | LP | Median power | $CO_2$ |

Other ash/etch gases may be used in combination with or instead of $CO_2$ within the scope of this invention. The other gases include $O_2$, CO, $N_2$, $N_2/H_2$, $NH_3$, and combinations thereof. These gases are typically used in plasma ash processes. Further, other reactive etching gases may be used within the scope of this invention, including $SF_6$, $NF_3$, $F_2$ and gases in the family of $C_xF_y$, $CH_xF_y$, and combinations of any of those gases. The plasma process may be performed in, for example, ICP or RIE type reactor. The etch process and the ash/flush process may be performed in the same reactor and further may be performed in the same reactor chamber. The pressure may be less than 100 mT, preferably about 10 mT. The RF power frequency in the ash/flush plasma process may be less than about 27 MHz, preferably about 13 MHz. The gas flow in the ash/flush process of the combined gases may be greater than 150 sccm, preferably about 300 sccm.

FIG. 3 shows the wafer number along the x-axis of the plot and the k values for the wafers along the y-axis. Two values are plotted for each wafer. Plain columns depict the k values of the low-k dielectric layer after deposition. The plain column is the base or control k value before etch and ash/flush processing. The cross-hatched columns are the post etch and post ash/flush k values. Each k value is displayed over the corresponding column for each wafer. The k degradation is calculated by subtracting the "as deposited" k value of the low-k dielectric layer for each wafer from the post ash/flush k value of the low-k dielectric layer of each wafer. The k degradation value for each wafer is listed within parentheses above each wafer on the plot. As can be seen from the plot, wafers 1 and 2 have the lowest k degradation. From the table above it can be seen that wafers 1 and 2 are the wafers that received an ash/flush process that included the reactive etching gas $C_4F_8$. Wafers 3 and 4 received an ash/flush process that did not include a reactive gas and the corresponding k degradation values for those wafers are higher.

Figure 4A:
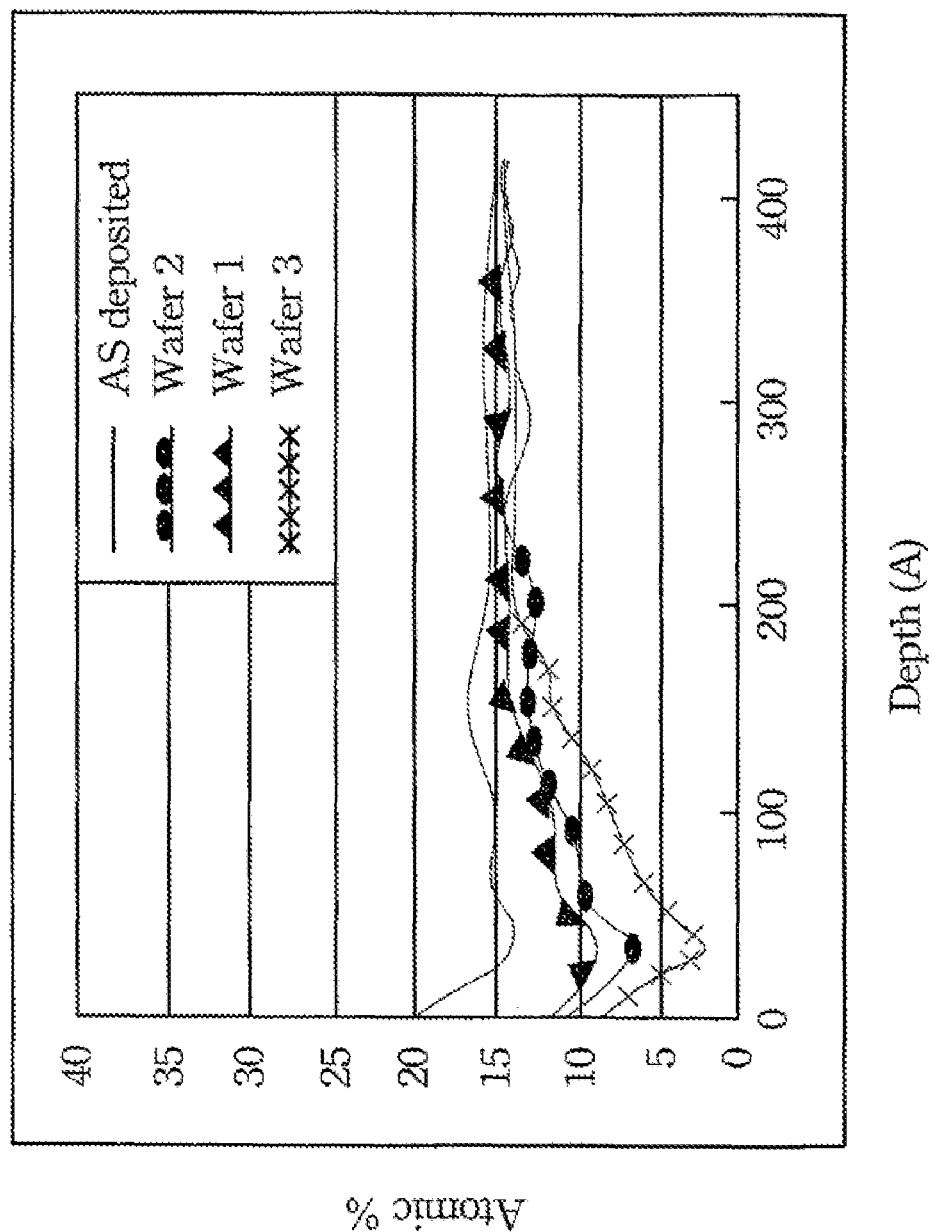
FIGS. 4A and 4B are overlays of the carbon and fluorine depth profiles, in accordance with the illustrative embodiments of the present invention.
Figure 4B:
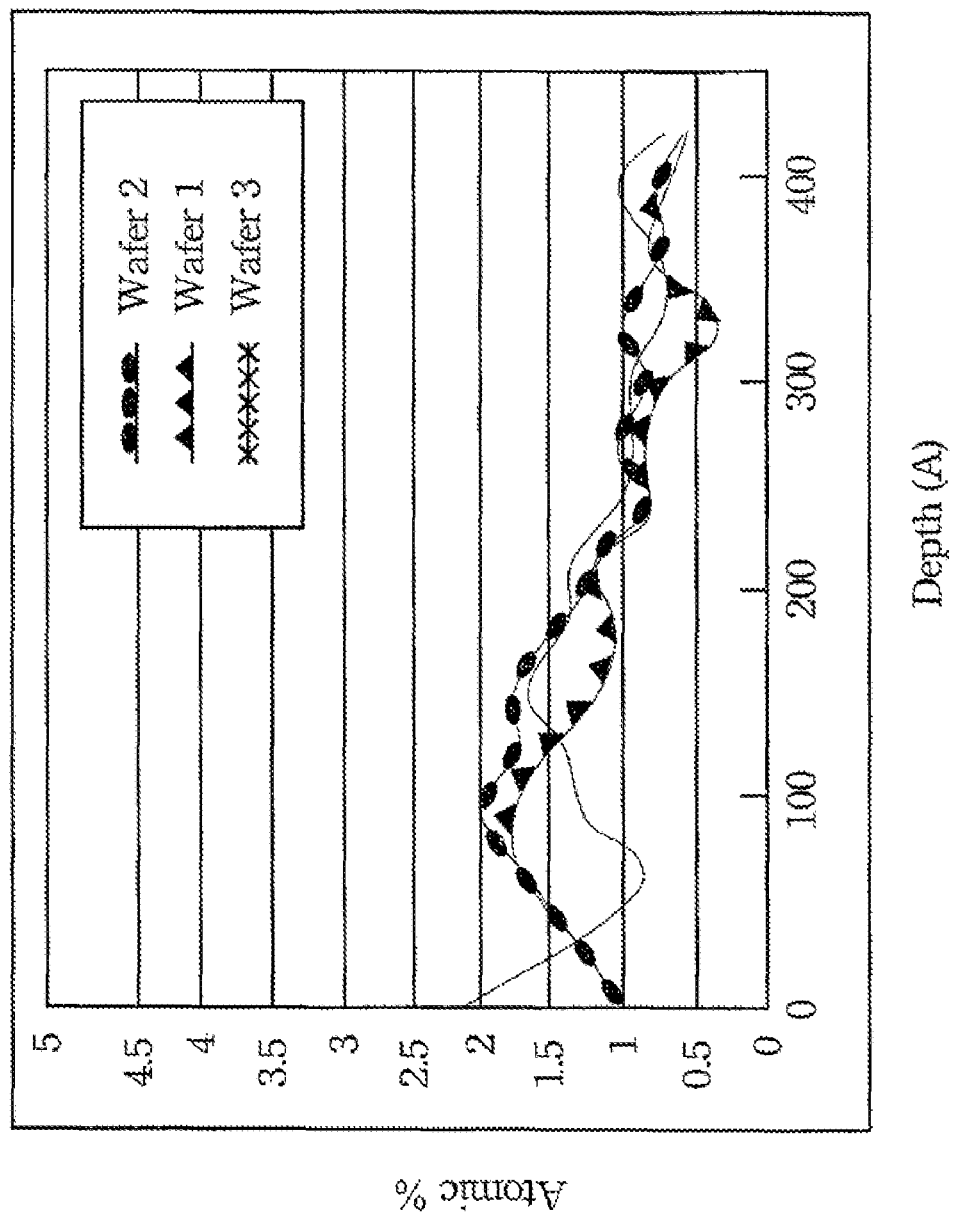

FIGS. 4A and 4B are overlays of the carbon and fluorine depth profiles in accordance with the illustrative embodiments of the present invention. Both charts indicate the percentage of the target element by depth of the wafer. The test result labeled "As Deposited" is the control wafer that did not undergo the etch/ash/flush processes. The remaining results were obtained from wafers with a blanket deposition of low-k dielectric that was then etched. Each wafer then was subjected to a different ash/flush process.

As can be seen from FIG. 4A, the carbon content of the wafers that were subjected to a reactive etch gas ash/flush process is greater than the wafer that did not use a reactive etch gas for the ash/flush process. In this example the reactive etch gas that was added to the ash/flush gas is $C_4F_8$; however, other reactive etch gases are within the scope of the illustrative embodiments of the invention.

From FIG. 4B, it can be seen that the wafers that used the reactive etch gas in the ash/flush process have less fluorine than the wafer that was subjected to no reactive etch gas during ash/flush processing.

Figure 5:
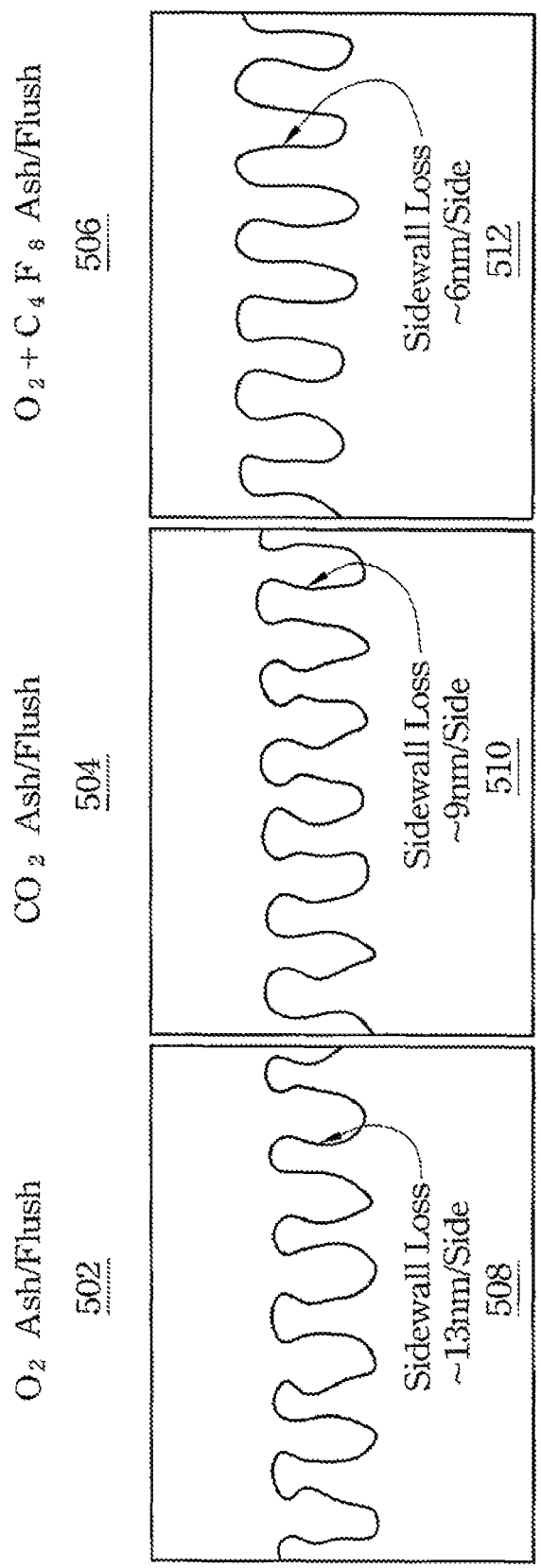
FIG. 5 is a sketch of scanning electron microscope images of post dilute HF stained trench profile that is in the low-k dielectric following etch and subsequent ash/flush processing in accordance with the illustrative embodiments of the present invention.

FIG. 5 are scanning electron microscope images of the trench profiles that are stained by dilute HF, where the trench profiles formed in a low-k dielectric layer following an etch and subsequent ash/flush processing. Image 502 is of the sidewall region of a wafer that underwent an ash/flush process of $O_2$. The sidewall loss 508 was measured to be approximately 13 nm per side. Image 504 is the sidewall region of a wafer that underwent an ash/flush process using $CO_2$. The sidewall loss 510 was measured to be approximately 9 nm per side. Image 506 shows the sidewall region of an ash/flush process using $O_2$ and the reactive etch gas $C_4F_8$. The sidewall loss 512 was measured to be approximately 6 nm per side. As can be seen from the pictures and noted further in the sidewall loss measurements found below each picture, the sidewalls depicted on the wafer that received the $O_2$ plus reactive etch gas $C_4F_8$, showed the least amount of sidewall loss post-stained by dilute HF.

Adding a reactive etch gas to the ash/flush plasma process gas in accordance with the illustrative embodiments results in less carbon depletion, less fluorine, and less sidewall loss. Therefore, devices formed using the illustrative embodiments of the present invention exhibit lower resistance and lower capacitance metal lines and interconnect structures, which translates to a lower RC delay time and a better performing integrated circuit.

Although the present invention and its advantages have been described in detail, it should be understood that various changes, substitutions, and alterations may be made herein without departing from the spirit and scope of the invention as defined by the appended claims. For example, it will be readily understood by those skilled in the art that process parameters may be varied while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a damascene process on a semiconductor wafer, the method comprising:
   depositing a layer of low-k dielectric on the wafer;
   patterning a photoresist layer on the layer of low-k dielectric;
   performing a damascene etch on the layer of low-k dielectric; and
   performing an ash/flush plasma process on the photoresist layer to remove the photoresist layer and on exposed portions of the layer of low-k dielectric, the ash/flush process using a combined ash/flush gas, the combined ash/flush gas comprising an ash/flush gas with a reactive etching gas, the ash/flush process not etching the layer of low-k dielectric.

2. The method of claim 1, wherein the ash/flush gas is selected from a group consisting essentially of $O_2$, CO, $CO_2$, $N_2$, $N_2/H_2$, $NH_3$, and a combination thereof.

3. The method of claim 2, wherein the ash/flush gas is essentially $O_2$.

4. The method of claim 2, wherein the ash/flush gas is essentially $CO_2$.

5. The method of claim 1, wherein the reactive etching gas is selected from a group consisting essentially of $C_4F_2$, $C_4F_8$, $C_5F_6$, $C_5F_8$, $CF_4$, $CF_3$, $CHF_3$, $CH_2F_2$, $SF_6$, $NF_3$, $F_2$ and a combination thereof.

6. The method of claim 5, wherein the reactive etching gas is essentially $C_4F_2$.

7. The method of claim 1, wherein a percentage the reactive etching gas to the ash/flush gas is within a range of one to twenty percent.

8. The method of claim 1, wherein an RF power frequency in the ash/flush plasma process is less than 27 MegaHertz (MHz).

9. The method of claim 1, wherein a pressure in the ash/flush plasma process is less than 100 millitorr (mT).

10. The method of claim 1, wherein a gas flow of the combined ash/flush gas is greater than 150 sccm (standard cubic centimeters per minute).

11. The method of claim 1, wherein the performing the damascene etch on the layer of low-k dielectric and the performing the ash/flush plasma process are performed in a same plasma chamber.

12. The method of claim 1, wherein the performing the ash/flush plasma process removes a damaged low-k dielectric layer.

13. A method comprising:
    depositing a low-k dielectric layer on a substrate;
    patterning a photoresist over the low-k dielectric layer;
    etching the low-k dielectric layer; and
    removing the photoresist and a damaged low-k dielectric layer simultaneously, the removing using a gas comprising an ash/flush gas and a reactive etching gas, the removing the photoresist and the damaged low-k dielectric layer not etching the low-k dielectric layer.

14. The method of claim 13, wherein the damaged low-k dielectric layer comprises a by-product of the etching the low-k dielectric layer.

15. The method of claim 13, wherein the ash/flush gas is selected from a group consisting essentially of $O_2$, CO, $CO_2$, $N_2$, $N_2/H_2$, $NH_3$, and a combination thereof.

16. The method of claim 13, wherein the reactive etching gas is selected from a group consisting essentially of $C_4F_2$, $C_4F_8$, $C_5F_6$, $C_5F_8$, $CF_4$, $CF_3$, $CHF_3$, $CH_2F_2$, $SF_6$, $NF_3$, $F_2$ and a combination thereof.

* * * * *